(12) United States Patent
Bischoff et al.

(10) Patent No.: US 7,859,641 B2
(45) Date of Patent: Dec. 28, 2010

(54) OPTICAL ELEMENT MODULE

(75) Inventors: Thomas Bischoff, Aalen (DE); Hagen Federau, Meersburg (DE); Willi Heintel, Aalen (DE); Bernd Wuesthoff, Frankfurt am Main (DE); Jochen Wieland, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 303 days.

(21) Appl. No.: 12/015,894

(22) Filed: Jan. 17, 2008

(65) Prior Publication Data

US 2008/0239270 A1 Oct. 2, 2008

Related U.S. Application Data

(63) Continuation of application No. PCT/EP2006/064427, filed on Jul. 19, 2006.

(60) Provisional application No. 60/700,517, filed on Jul. 19, 2005.

(51) Int. Cl.
G03B 27/52 (2006.01)
G03B 27/42 (2006.01)
G03B 27/32 (2006.01)
G02B 7/02 (2006.01)

(52) U.S. Cl. .................. 355/30; 355/53; 355/77; 359/811; 359/819; 359/820; 359/822

(58) Field of Classification Search .................. 355/30, 355/53, 67, 77; 359/811, 819, 820, 822
See application file for complete search history.

(56) References Cited

U.S. PATENT DOCUMENTS

| 4,147,413 | A | | 4/1979 | Sims et al. |
| 4,733,945 | A | * | 3/1988 | Bacich ........................ 359/820 |
| 5,523,893 | A | | 6/1996 | Haas |
| 6,392,825 | B1 | * | 5/2002 | Trunz et al. .................. 359/819 |
| 6,747,730 | B2 | * | 6/2004 | Box ............................. 355/53 |
| 6,867,848 | B2 | * | 3/2005 | Ebinuma et al. .............. 355/75 |
| 7,609,464 | B2 | * | 10/2009 | Rief et al. .................... 359/819 |
| 2001/0039126 | A1 | * | 11/2001 | Ebinuma et al. ............. 438/795 |
| 2004/0027549 | A1 | * | 2/2004 | Nagayama .................... 355/55 |

FOREIGN PATENT DOCUMENTS

| EP | 1 536 458 | 6/2005 |
| JP | 59 026706 | 2/1984 |
| JP | 61 017110 | 1/1986 |
| WO | WO 2005/054953 | 6/2005 |

* cited by examiner

*Primary Examiner*—Alan A Mathews
(74) *Attorney, Agent, or Firm*—Fish & Richardson P.C.

(57) ABSTRACT

An optical element module comprising a plurality of module components is provided. The module components comprise an optical element, an optical element holder and a contact element. The optical element has a first coefficient of thermal expansion. The optical element holder holds the optical element via the first contact element and has a second coefficient of thermal expansion, the second coefficient of thermal expansion being different from the first coefficient of thermal expansion. At least one of the module components is adapted to provide at least a reduction of forces introduced into the optical element upon a thermally induced position change in the relative position between the optical element and the optical element holder, the position change resulting from a temperature situation variation in a temperature situation of the plurality of module components.

79 Claims, 6 Drawing Sheets

OPTICAL ELEMENT MODULE

CROSS-REFERENCE TO RELATED APPLICATIONS

This patent disclosure is a continuation under 35 U.S.C. §120 of international application PCT/EP2006/064427, filed Jul. 19, 2006, which claims the benefit under 35 U.S.C. 119 (e)(1) of provisional U.S. Patent Application Ser. No. 60/700,517 filed 19 Jul. 2005. The entire contents of these applications are hereby incorporated herein by reference.

FIELD

The disclosure relates to optical element modules used in exposure processes, in particular to optical element modules of microlithography systems. It further relates to optical element units comprising such optical element modules. It also relates to optical exposure apparatuses comprising such optical element units. Furthermore, it relates to a method of holding an optical element. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices comprise a plurality of optical elements, such as lenses and mirrors etc., in the light path of the optical system. Those optical elements usually cooperate in an exposure process to transfer an image formed on a mask, reticle or the like onto a substrate such as a wafer. Said optical elements are usually combined in one or more functionally distinct optical element groups. These distinct optical element groups may be held by distinct optical element units. Such optical element units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical element units holding such optical element groups often have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system.

Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical elements of such an optical system is desirably supported in a defined manner in order to maintain a predetermined spatial relationship between said optical elements to provide a high quality exposure process.

In this context there exist, among others, two general requirements for the support of optical elements of the optical system. One is that the rigidity of the support system of the optical elements has to be as high as possible in certain directions, in particular in the direction of the optical axis, to keep the resonant frequencies of the system as high as possible. Furthermore, deformations of the optical elements of the optical system are to be avoided to the greatest possible extent in order to keep imaging errors resulting from such deformations as low as possible.

One such imaging error is for example stress induced birefringence of refractive optical elements. Such stress induced birefringence mainly results from stresses introduced into the optical element via its peripheral support structure and radially propagating through the optically used area of the optical element. Such stresses are often thermally induced, resulting from differences in the coefficient of thermal expansion (CTE) of the optical element and its peripheral support structure. Variations in the temperature situation of the optical element and its peripheral support structure lead to relative movements between the optical element and its peripheral support structure. These relative movements are counteracted by the holding forces acting between the optical element and its peripheral support structure leading to the above undesired stress situations.

To avoid thermally induced stresses and deformations within an optical element due to differences in the coefficient of thermal expansion of the optical element and its optical element holder, it is known to connect the optical element and its optical element holder via deformation uncoupling elements. These deformation uncoupling elements generally allow for relative movements between the optical element and its optical element holder.

These deformation uncoupling elements may provide a reduction of the stresses and, thus, the deformations introduced into the optical element. However, they have the disadvantage that they also reduce the rigidity of the support system. To deal with this effect, the rigidity of the uncoupling elements might be increased, but this would reduce their deformation uncoupling abilities leading to increased stresses and, thus, the deformations introduced into the optical element.

Another approach to deal with this problem is known from US 2001/0039126 A1 (to Ebinuma et al.). Here, it is provided for an adaptation of the coefficients of thermal expansion between an optical element and a support ring contacting the optical element in order to reduce the introduction of thermally induced deformations into the optical element resulting from differences in the coefficients of thermal expansion. However, this solution my have the disadvantage that, for certain optical elements with a certain coefficient of thermal expansion, the adaptation of the coefficient of thermal expansion may only be achieved with comparatively expensive materials for such large parts as the support ring.

SUMMARY

It is thus an object of the disclosure to, at least to some extent, overcome the above disadvantages and to provide good and long term reliable imaging properties of an optical system used in an exposure process.

It is a further object of the disclosure to increase imaging accuracy of an optical system used in an exposure process by reducing thermally induced stresses introduced into an optical element of the optical system.

It is a further object of the disclosure to increase imaging accuracy of an optical system used in an exposure process by reducing stress induced birefringence introduced into an optical element of the optical system via its support structure.

These objects are achieved which is based on the teaching that a reduction in the deformations introduced into an optical element of the optical system via its support structure and a high rigidity of the support mechanism for the optical element may be achieved when at least one of the module components of an optical element module is adapted to provide, compared to conventional deformation uncoupling elements, at least a reduction of forces introduced into the optical element upon a thermally induced position change in the relative position between the optical element and the optical element holder by maintaining, at the same time, a high rigidity of the support mechanism. This reduction of disturbing forces upon maintained support rigidity may be achieved in several ways.

One solution is to provide a contact element that compensates by its thermal expansion properties for the difference in the coefficient of thermal expansion between the optical element and the associated optical element holder such that, at least at a given variation in the temperature situation, no relative shift between the contact points of the module components occurs. With this solution, the thermally induced introduction of disturbing forces into the optical element may even be completely avoided. This solution has the further advantage that, compared to the known adaptation of the coefficients of thermal expansion of the optical element and the optical element holder, with the contact element only a relatively small part has to be adapted to the given coefficient of thermal expansion situation. Furthermore, at a given coefficient of thermal expansion situation, adaptation may be provided easily by simply adapting the effective distance between the contact points of the contact element with the optical element and the optical element holder, respectively.

A second solution is to allow for a relative movement between the optical element and the associated optical element holder at a variation in the temperature situation, but to reduce the disturbing forces introduced into the optical element as a result of such a relative movement. Since these disturbing forces predominantly result from frictional forces between the coupled module components, a reduction of these frictional forces at the interface of the coupled module components is provided. This may be achieved by adapting the frictional properties of the module components at the interface location to provide a low friction contact. Furthermore, the relative motion between the module components may be adapted to provide a type of motion with low friction. In some embodiments, due to the low frictional forces transmitted at such a motion type, a rolling motion is provided at the interface location between the module components.

A third solution is to overall reduce, under normal operating conditions, the holding forces exerted on the optical element and, thus, also the disturbing forces introduced into the optical element at a thermally induced relative movement between the module components. This solution is based on the concept that the holding forces usually counteract also the thermally induced relative movement between the module components and, thus, have an influence on the frictional forces introduced into the optical element at such a relative movement between the module components. Usually, due to the manufacture and mounting of the optical system at a location different from the location of its later use, the holding forces provided for the optical elements do not only account for the forces occurring under normal operating conditions of the optical system but also have to account for considerably higher abnormal forces occurring during, for example, transport of the optical system. Thus, in conventional systems, holding forces are considerably higher than necessary in normal use. This obviously leads to considerable disturbing forces introduced into the optical element at a thermally induced relative movement between the module components. These disturbing forces can be reduced by providing a securing device which is only activated under abnormal load conditions in order to hold the optical element in place. Thus, under normal operating conditions, holding forces which are considerably lower than in conventional systems may be applied to the optical element leading, in turn, to reduced disturbing forces.

It will be appreciated that arbitrary combinations of the above solutions may be selected to combine their beneficial effects and to further reduce the disturbing forces introduced into the optical element at thermally induced relative movements between some of the module components.

Thus, according to a first aspect of the disclosure there is provided an optical element module comprising an optical element, an optical element holder and a first contact element. The optical element has a first coefficient of thermal expansion. The optical element holder holds the optical element via the first contact element and has a second coefficient of thermal expansion, the second coefficient of thermal expansion being different from the first coefficient of thermal expansion. A first contact point is formed on a first module component, the first module component being one of the optical element and the optical element holder. The first contact element has a second contact point and a third coefficient of thermal expansion. At a first temperature situation, the first contact point contacts the second contact point at a first location. Furthermore, the first contact element contacts a second module component at a second location, the second location, at the first temperature situation, being located at a first contact location distance from the first location, and the second module component being different from the first module component and being one of the optical element and the optical element holder. At least one of the third coefficient of thermal expansion and the contact location distance is selected such that, at a given second temperature situation different from the first temperature situation, a thermally induced modification in the size of the first contact element with respect to the first temperature situation compensates for the difference between the first coefficient of thermal expansion and the second coefficient of thermal expansion such that, at the second temperature situation, there is substantially no shift between the first contact point and the second contact point.

According to a second aspect of the disclosure there is provided an optical element module comprising an optical element, an optical element holder and a first contact element. The optical element has a first coefficient of thermal expansion. The optical element holder holds the optical element via the first contact element and has a second coefficient of thermal expansion, the second coefficient of thermal expansion being different from the first coefficient of thermal expansion. One of the optical element and the optical element holder forms a first module component and one of the optical element and the optical element holder forms a second module component being different from the first module component. A first contact surface is formed on the first module component, the first contact element having a curved second contact surface contacting the first contact surface. The first contact element is adapted such that the second contact surface executes a rolling motion with respect to the first contact surface upon a thermally induced change in the relative position between the optical element and the optical element holder.

According to a third aspect of the disclosure there is provided an optical element module comprising a plurality of module components. The module components comprise an optical element, an optical element holder and a contact element. The optical element has a first coefficient of thermal expansion. The optical element holder holds the optical element via the first contact element and has a second coefficient of thermal expansion, the second coefficient of thermal expansion being different from the first coefficient of thermal expansion. At least one of the module components is adapted to provide at least a reduction of forces introduced into the optical element upon a thermally induced position change in the relative position between the optical element and the optical element holder, the position change resulting from a temperature situation variation in a temperature situation of the plurality of module components.

According to a fourth aspect of the disclosure there is provided an optical element unit comprising a plurality of optical element modules connected to each other and supporting a plurality of optical elements. The plurality of optical element modules comprises a first optical element module being an optical element module.

According to a fifth aspect of the disclosure there is provided an optical exposure apparatus for transferring an image of a pattern formed on a mask onto a substrate comprising a light path, a mask location located within the light path and receiving the mask, a substrate location located at an end of the light path and receiving the substrate and an optical element unit located within the light path between the mask location and the and the substrate location.

According to a sixth aspect of the disclosure there is provided a method of holding an optical element comprising, in a first step, providing a plurality of module components, the module components comprising an optical element, an optical element holder and a contact element, and, in a second step, holding the optical element using the optical element holder, the optical element holder holding the optical element via the contact element. The optical element having a first coefficient of thermal expansion. The optical element holder has a second coefficient of thermal expansion, the second coefficient of thermal expansion being different from the first coefficient of thermal expansion. At least one of the module components is adapted to provide at least a reduction of forces introduced into the optical element upon a thermally induced position change in the relative position between the optical element and the optical element holder, the position change resulting from a temperature situation variation in a temperature situation of the plurality of module components.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION OF THE DISCLOSURE

First Embodiment

Figure 1:
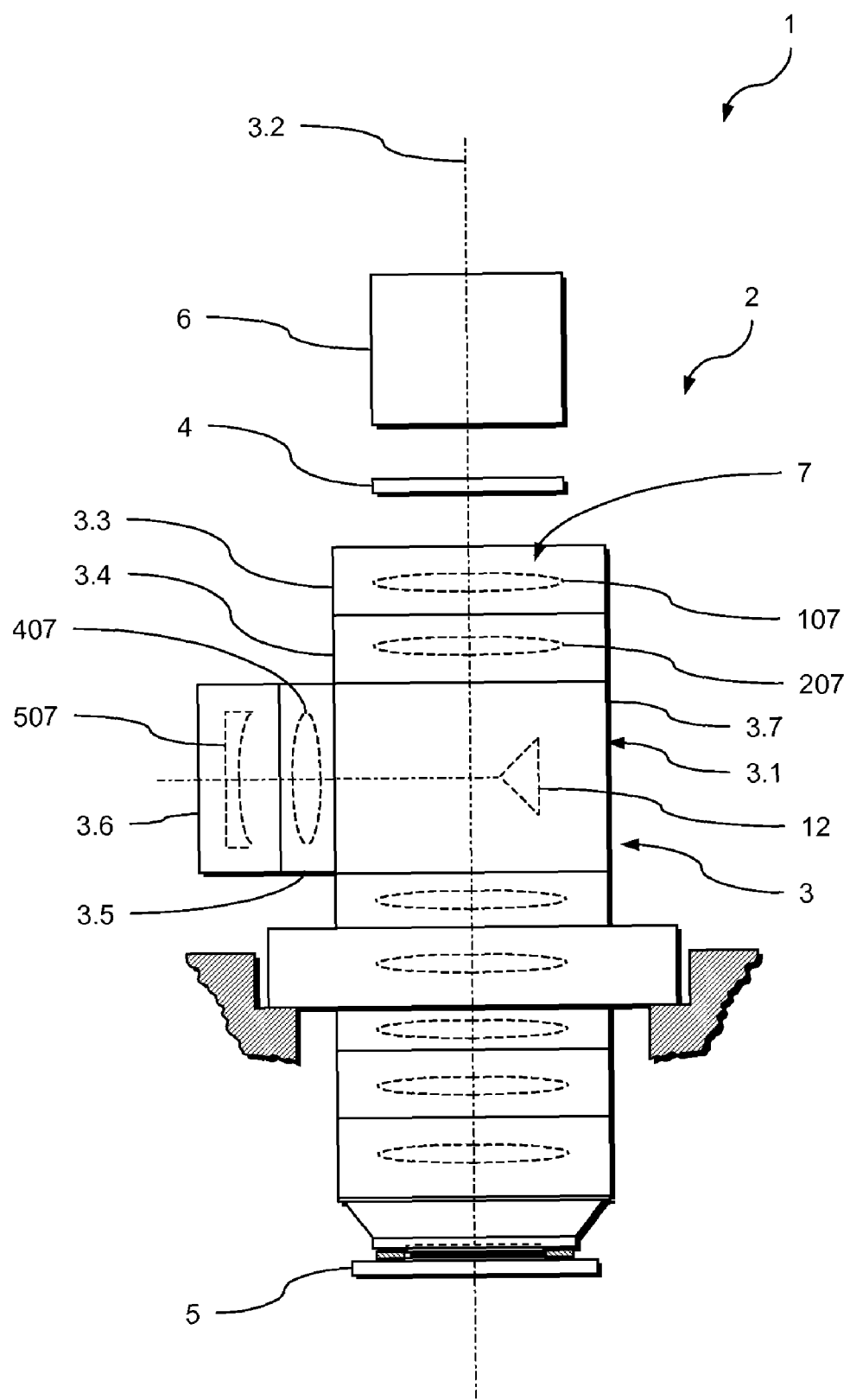
FIG. 1 is a schematic representation of an optical exposure apparatus comprising preferred embodiments of an optical element unit and optical element modules.

In the following, a first preferred embodiment of an optical exposure apparatus 1 comprising an optical projection system 2 with an optical element unit 3 will be described with reference to FIGS. 1 and 2.

The optical exposure apparatus 1 is adapted to transfer an image of a pattern formed on a mask 4 onto a substrate 5. To this end, the optical exposure apparatus 1 comprises an illumination system 6 illuminating said mask 4 and the optical element unit 3. The optical element unit 3 projects the image of the pattern formed on the mask 4 onto the substrate 5, e.g. a wafer or the like.

To this end, the optical element unit 3 holds an optical element group 7. This optical element group 7 is held within a housing 3.1 of the optical element unit 3. The optical element group 7 comprises a number of optical elements 107 and 207 as well as optical elements 407 and 507 such as lenses, mirrors or the like. These optical elements 107, 207, 407, 507 are aligned along a folded optical axis 3.2 of the optical element unit 3.

The optical projection system 2 receives the part of the light path between the mask 4 and the substrate 5. Its optical elements 107, 207, 407, 507 cooperate to transfer the image of the pattern formed on the mask 4 onto the substrate 5 located at the end of the light path. To increase the numerical aperture NA of the optical projection system 2, the optical projection system 2 may comprise an immersion zone located between the lower end of the optical element unit 3 and the substrate 5.

The optical element unit 3 is composed of a plurality of optical element modules 3.3 and 3.4, optical element modules 3.5 and 3.6 as well as an optical element module 3.7 stacked and tightly connected to form the optical element unit 3. Each optical element module 3.3 to 3.6 holds one or more of the optical elements 107, 207, 407, 507, respectively. The optical element module 3.7 is an interface module holding a reflecting optical element 12 used to fold the optical axis 3.2. The optical element module 3.7 is an interface module providing an interface for the respective module stack.

Figure 2:
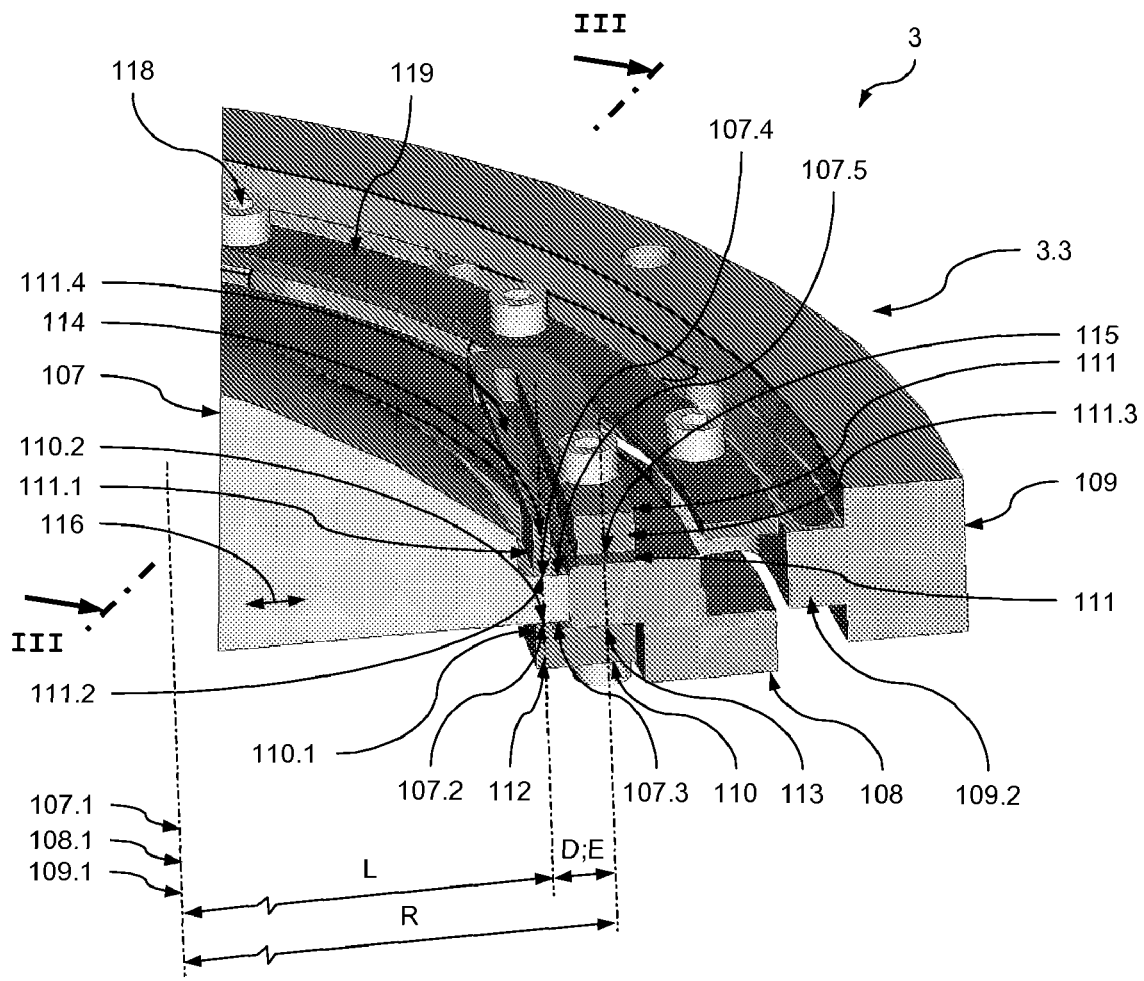
FIG. 2 is a perspective view of a schematic sectional representation of a part of an optical element unit of the optical exposure apparatus of FIG. 1.

FIG. 2 shows a schematic perspective view of a sectional representation of a part of the optical element module 3.3 of the optical element unit 3 at a first temperature situation T1 of the optical element unit 3. The first temperature situation T1 is characterized by a certain temperature profile within the components of the optical element unit 3.

The optical element 107 of the optical element module 3.3 is a rotationally symmetric lens having an optical axis 107.1. The lens 107 is made of Quartz (SiO$_2$) and has a first coefficient of thermal expansion.

The lens 107 is usually positioned in space such that the optical axis 107.1 of the lens 107 is substantially collinear with the optical axis 3.2 of the optical element unit 3. It should be noted that the position of the optical axis 107.1 of the lens 107 shown in FIG. 2 is not to scale. In reality, the optical axis 107.1 is located at a distance from the outer circumference of the lens 107 that by far exceeds the distance shown in FIG. 2.

The lens 107 is held by an optical element holder in the form of a ring shaped lens holder 108 which, in turn, is held by a ring shaped frame element 109. The lens holder 108 is made of Invar that has a second coefficient of thermal expansion different from, namely larger than the first coefficient of thermal expansion of the lens 107. The lens holder 108 holds the lens 107 in place via a plurality of first contact elements 110 and a plurality of second contact elements 111. In the sectional view of FIG. 2, half of a first contact element 110 and half of a second contact element 111 is shown, both contact elements 110 and 111 being symmetric with respect to the sectional plane.

In the embodiment shown, three first contact elements 110 and three second contact elements 111 are evenly distributed at the inner circumference of the lens holder 108. However, it will be appreciated that, with other embodiments of the disclosure, a different number of first and/or second contact elements may be provided. Thus, for example, a large number of narrowly spaced first and/or second contact elements may be formed to provide a configuration similar to the one disclosed in the context of FIG. 2 of U.S. Pat. No. 6,392,825 B1 (Trunz et al.), the entire disclosure of which is hereby incorporated herein by reference. In such a configuration, the respective first and/or second contact elements may be formed by a radially resilient element similar to the ones disclosed in the context of FIG. 4 of U.S. Pat. No. 4,733,945 (Bacich), the entire disclosure of which is hereby incorporated herein by reference. Furthermore, these first and/or second contact elements may be formed as separate elements or monolithically connected—in groups or altogether—via a contact element connecting element, e.g. a connecting ring similar to the one shown in FIG. 2 of U.S. Pat. No. 6,392,825 B1 (Trunz et al.), which is then connected lens holder. Furthermore, only one type of contact elements may be provided. For example, only the lower first contact elements may be provided to support the lens from below.

At the first temperature situation T1, a first contact nose 110.1 formed on one end of the first contact element 110 contacts the lens 107 at a first location 112. Thereby a first contact point 107.2 of a plane first contact surface 107.3 of the lens 107 is contacted by a second contact point 110.2 on the first contact nose 110.1 of the first contact element 110. Furthermore, the first contact element 110 contacts the lens holder 108 at a second location 113, where the first contact element 110 is connected to the lens holder 108 by means of screws or any other suitable fastening technique.

Similarly a second contact nose 111.1 formed on one end of the second contact element 111 contacts the lens 107 at a third location 114. Thereby a third contact point 107.4 of a plane third contact surface 107.5 of the lens 107 is contacted by a fourth contact point 111.2 on the second contact nose 111.1 of the second contact element 111. Furthermore, the second contact element 111 contacts the lens holder 108 at a fourth location 115, where the second contact element 111 is connected to the lens holder 108 by means of screws or any other suitable fastening technique.

It will be appreciated that, with other embodiments of the disclosure, the first and third contact surface may be curved surfaces as well. Furthermore, the optical element may form contact one or both noses as well, while one or both contact elements form plane contact surfaces.

Along the optical axis 107.1, the first location 112 is aligned with the third location 114 and the second location 113 is aligned with the fourth location 115. Thus, both, the first location 112 and the second location 113 as well as the third location 114 and the fourth location 115 are spaced apart in a radial direction 116 of the optical element module 3.3 by a contact location distance D.

In general, in the radial direction 116, as a function of the temperature situation T and the first coefficient of thermal expansion $\alpha_L$ of the lens 107, the first and third contact point 107.2 and 107.4 are located at a radius $L(T;\alpha_L)$ from the optical axis 107.1. Furthermore, as a function of the temperature situation T and the second coefficient of thermal expansion $\alpha_R$ of the lens holder 108, the second location 113 and the third location 115 are located at a radius $R(T;\alpha_R)$ from the optical axis 107.1. Thus, as a function of the temperature situation T, the first coefficient of thermal expansion $\alpha_L$ and the second coefficient of thermal expansion $\alpha_R$, the contact location distance $D(T;\alpha_L;\alpha_R)$ follows the equation:

$$D(T;\alpha_L;\alpha_R)=R(T;\alpha_R)-L(T;\alpha_L). \qquad (1)$$

The first contact element 110 is designed such that, at the first temperature situation T1 shown in FIG. 2, the distance E in the radial direction 116 between its second contact point 110.2 and the second location 113 (where the first contact element 110 is fixedly connected to the lens holder 108) is equal to the contact location distance $D(T;\alpha_L;\alpha_R)$. Furthermore, the second contact element 111 is designed such that, at the first temperature situation T1 shown in FIG. 2, the distance E in the radial direction 116 between its fourth contact point 111.2 and the fourth location 115 (where the second contact element 111 is fixedly connected to the lens holder 108) is also equal to the contact location distance $D(T;\alpha_L;\alpha_R)$.

In general, the distance E again is a function of the temperature situation T and of the coefficient of thermal expansion $\alpha_E$ of the respective contact element 110, 111, i.e. $E(T;\alpha_E)$. Thus, at the first temperature situation T1 the following equation is valid:

$$D(T1;\alpha_L;\alpha_R)=E(T1;\alpha_E) \qquad (2)$$

It should be noted that, in the embodiment shown in FIG. 2, the first and second contact element 110, 111 are made of the same material having a third coefficient of thermal expansion. However it will be appreciated that they may also be made of different materials with different coefficients of thermal expansion, which would then have to be accounted or in the above Equation (2).

While the first contact element 110 is a substantially rigid element, the second contact element 111 is formed such that its second contact nose 111.1 is supported in a manner to be resilient in a direction parallel to the optical axis 107.1 of the optical element 107. To this end, the second contact nose 111.1 is connected to a base part 111.3 of the second contact element 111 via two leaf spring arms 111.4.

The second contact nose 111.1 protrudes from the second contact element 111 in such a manner that the arms 111.4 are elastically deflected when the base part 111.3 is screwed to the lens holder 108. As a consequence, the second contact nose 111.1 exerts a clamping force F1 onto the second contact surface 107.5 of the lens 107, said clamping force F1 being substantially perpendicular to the second contact surface 107.5. The amount of the clamping force may be adjusted by a spacer 111.5 of suitable thickness placed between the base part 111.3 and the lens holder 108.

The first contact nose 110.1 protruding from the first contact element 110 exerts a counteracting force F2 onto the first contact surface 107.3 of the lens 107, said counteracting force F2 being substantially perpendicular to the first contact surface 107.3. The first contact nose 110.1 and the second contact nose 111.1 are arranged such that the counteracting force F2 is collinear with the clamping force F1 and counteracts the clamping force F1. In other words, the lens is clamped between the respective first contact element 110 and the associated second contact element 111.

The first contact surface 107.3 and the second contact surface 107.5 are substantially perpendicular to the optical axis 107.1 of the lens. Thus, at the first temperature situation T1, substantially no radial forces directed radially towards the center of the lens 107 are introduced into the lens by its holding mechanism.

At a second temperature situation T2 different from the first temperature situation T1, the temperature within the components of the optical element unit 3 is raised by a given amount. As a consequence of the raised temperature, among others, the lens 107 and the lens holder 108 expand in a radial direction 116. Since the second coefficient of thermal expansion of the lens holder 108 is higher than the first coefficient of thermal expansion of the lens 107, the raise in the temperature causes a relative movement between the lens 107 and the lens holder 108 in the radial direction 116 such that the lens holder 108 radially moves away from the lens 107. In other words, the contact location distance $D(T;\alpha_L;\alpha_R)$ increases according to Equation (1).

In conventional systems with a conventional clamping mechanism, this would lead to a relative radial movement and a residual elastic deformation at the interface between the respective contact element and the lens, both leading to the introduction of stresses into the optical element radially propagating through the optically used area of the lens. As previously explained, such radial stresses lead to imaging errors such as stress induced birefringence.

However, the first contact element 110 and the second contact element 111 compensate for this difference in the first and second coefficient of thermal expansion such that, at the second temperature situation T2, there is substantially no shift between the first contact point 107.2 and the second contact point 110.2 as well as substantially no shift between the third contact point 107.4 and the fourth contact point 111.2.

To this end, the first contact elements 110 and the second contact elements 111 are made of a steel material having a third coefficient of thermal expansion different from the first and second coefficient of thermal expansion of the lens 107 and the lens holder 108, respectively. The third coefficient of thermal expansion is higher than the first and second coefficient of thermal expansion.

For the first contact elements 110, at least one of the second location 113 and the third coefficient of thermal expansion $\alpha_E$ are selected such that $$E(T2;\alpha_E)=D(T2;\alpha_L;\alpha_R)=R(T2;\alpha_R)-L(T2;\alpha_L). \quad (3)$$

The same applies for the second contact elements 111, i.e. at least one of the fourth location 115 and the third coefficient of thermal expansion $\alpha_E$ are selected such that Equation (3) is valid.

In other words, due to the higher thermal expansion of the first and second contact elements 110 and 111, the respective contact element 110, 111, at the given temperature situation variation between the first and second temperature situation T1 and T2, spans the gap between the lens 107 and the lens holder 108 that results from the difference in the first and second coefficient of thermal expansion of the lens 107 and the lens holder 108, respectively. Thus, at the second temperature situation T2 as well, despite the thermal expansion of the module components, substantially The first and second contact elements do not necessarily have to be fixedly mounted to the optical element holder. It will be appreciated that, with other embodiments of the disclosure, in the manner of a kinematic reversal, at least one of the respective first and second contact element may be fixedly mounted to the optical element and contact the optical element holder in the manner as it has been described above for the contact between the contact elements 110, 111 and the lens 107.

It will be appreciated that, with other embodiments of the disclosure, other materials or combinations may be chosen. In any case, the compensation of the difference in the coefficient of thermal expansion between the lens holder and the lens by suitably selecting the material (i.e. the coefficient of thermal expansion), the size, and the location of the respective contact element.

It will be further appreciated that the compensation of the difference in the first coefficient of thermal expansion of the lens 107 and the second coefficient of thermal expansion of the lens holder 108 provided by the first and second contact elements 110 and 111 may be effective during the entire temperature situation variation, i.e. the transition between the first temperature situation T1 and the second temperature situation T2. However, depending on the change in the temperature profile in the module components (lens 107, lens holder 108 and contact elements 110, 111) during the temperature situation variation, the first and second contact elements 110 and 111 may not provide for a complete compensation during the entire temperature situation variation.

Thus, it may be that, during the transition between the first temperature situation T1 and the second temperature situation T2, certain thermally induced radial disturbing forces are introduced into the lens 107. However, the disclosure also provides for a reduction of these thermally induced radial disturbing by the following means.

Figure 3:
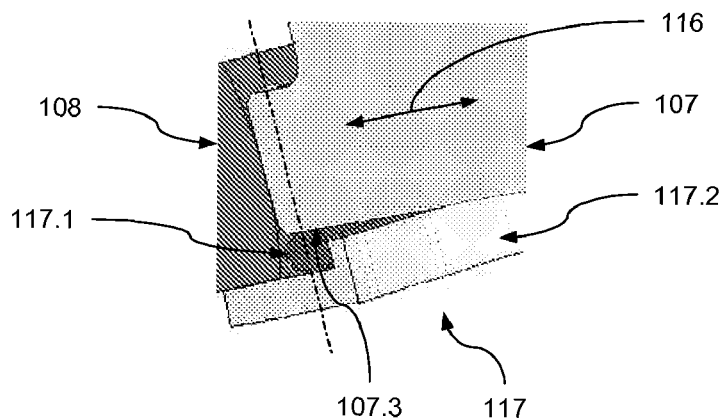
FIG. 3 is a perspective view of schematic sectional representation of another part of the optical element unit along line III-III of FIG. 2.

First of all, as may be seen from FIG. 3, a gravity compensation means 117 is provided. This gravity compensation means 117 is mounted to the lens holder 108 and located close to the outer circumference of the lens 107. The gravity compensation means 117, in sum, exerts a force onto the lens that balances the gravitational force acting onto the lens 107 due to its mass.

To this end, the gravity compensation means 117 comprises force generating means 117.1 contacting the first contact surface 107.3 of the lens 107 over a certain fraction of the outer circumference of the lens 107. In the embodiment of FIG. 3, three force generating means 117.1 are extend over substantially the entire part of the circumference of the lens 107 that is not taken by the first contact elements 110.

Each force generating means 117.1 exerts a line force onto the lens 107 that is parallel to the optical axis 107.1 of the lens. The force generating means 117.1 is provided in the form of a helical spring with elliptical coils that are inclined with respect to the spring axis such as a so called BAL SPRING® manufactured by Bal Seal Engineering Co. Inc., Pauling, Calif., U.S.A. However, it will be appreciated that, with other embodiments of the disclosure, another number and other types of force generating means, e.g. leaf spring elements, magnetic or pneumatic elements etc., may be used for the gravity compensation means.

The force generating means 117.1 is supported on a support element 117.2 fixedly connected to the inner circumference of the lens holder 108. Here again, similar to the first contact element 110, the support element 117.2 may be made of a material with a coefficient of thermal expansion as well as mounted and designed such that it compensates for the difference in the first coefficient of thermal expansion of the lens 107 and the second coefficient of thermal expansion of the lens holder 108. In other words, the support element 117.2 may be designed such that, upon the above temperature situation variation, there is substantially no shift in the contact points between the force generating means 117.1 and the lens 107.

This avoids introduction of radial disturbing forces into the lens via the gravity compensation means 117. However, it will be appreciated that this complete compensation may also be omitted to some extent. For example a radial relative movement may be admitted between the force generating means 117.1 and the lens 107 upon thermal expansion since the force generating means 117.1, due to its design, may execute a rolling movement with respect to the first contact surface 107.3 of the lens 107. Such a rolling movement is associated with a very low rolling friction acting onto the lens 107 and, thus, leads to a considerably reduced introduction of disturbing radial forces into the lens 107. To further reduce the frictional forces introduced into the lens 107 at least one of the force generating means 117.1 and the first contact surface 107.3 of the lens 107 may be provided with a low friction coefficient contact surface, e.g. with a friction coefficient coating at the respective contact surface.

An advantage of the gravity compensation means 117 lies within the fact that the normal reaction force acting between the first contact elements 110 and the lens 107 perpendicular to the first contact surface 107.3 does not have to include a component resulting from the balancing of the gravitational force acting onto the lens 107. Thus, the first contact elements 110 only exert a reduced normal contact force only balancing the clamping force exerted by the associated second contact elements 111. This reduced normal contact force has the advantage that upon any thermally induced radial relative movement between the lens 107 and the first contact elements 110 only a reduced frictional disturbing force acts in the radial direction 116 onto the lens 107, said frictional disturbing force being a function of the normal contact force and the friction coefficient at the contact location.

A further reduction of the frictional disturbing force acting onto the lens 107 upon any thermally induced radial relative movement between the lens 107 and the contact elements 110 and 111 may be achieved by providing at least one of the lens 107 and the first and second contact nose 110.1 and 111.1 with a low friction coefficient contact surface, e.g. with a low friction coefficient coating at the respective contact surface, i.e. the first and second contact surface 107.3 and 107.5. and/or the contact surface of the first and second contact nose 110.1 and 111.1. By this means as well only a reduced frictional disturbing force acts in the radial direction 116 onto the lens 107 upon such a thermally induced radial relative movement, said frictional disturbing force being a function of the normal contact force and the friction coefficient at the respective contact location.

As mentioned above, the lens holder 108 is held by a ring shaped frame element 109. The frame element 109 itself may form a part of the housing 3.1 of the optical element unit 3 or may be connected to a separate part, said separate part then forming a part of the housing 3.1.

The lens holder 108 has a first axis of symmetry 108.1 substantially coinciding with the optical axis 107.1. The same applies to the frame element 109, i.e. the frame element 109 has a second axis of symmetry 109.1 substantially coinciding with the optical axis 107.1 as well.

For reasons of reduced weight and good thermal conductivity, the frame element 109 is made of aluminum. Thus, the frame element 109 has a fourth coefficient of thermal expansion different from the second coefficient of thermal expansion of the lens holder 108. To account for this fact, the lens holder 108 is connected to the frame element 109 via a plurality of radial deformation uncoupling elements 109.1 evenly distributed at the inner circumference of the frame element 109.

The lens holder 108 is connected to the frame element 109 via one screw 118 per deformation uncoupling element 109.1. To avoid distortion of the deformation uncoupling elements 109.1 when tightening the screws 118, a protection ring 119 is placed between the heads of the screws 118 and the deformation uncoupling elements 109.1.

In the following, a preferred embodiment of a method of holding an optical element according to the present disclosure will be described with reference to FIGS. 1 to 4.

Figure 4:
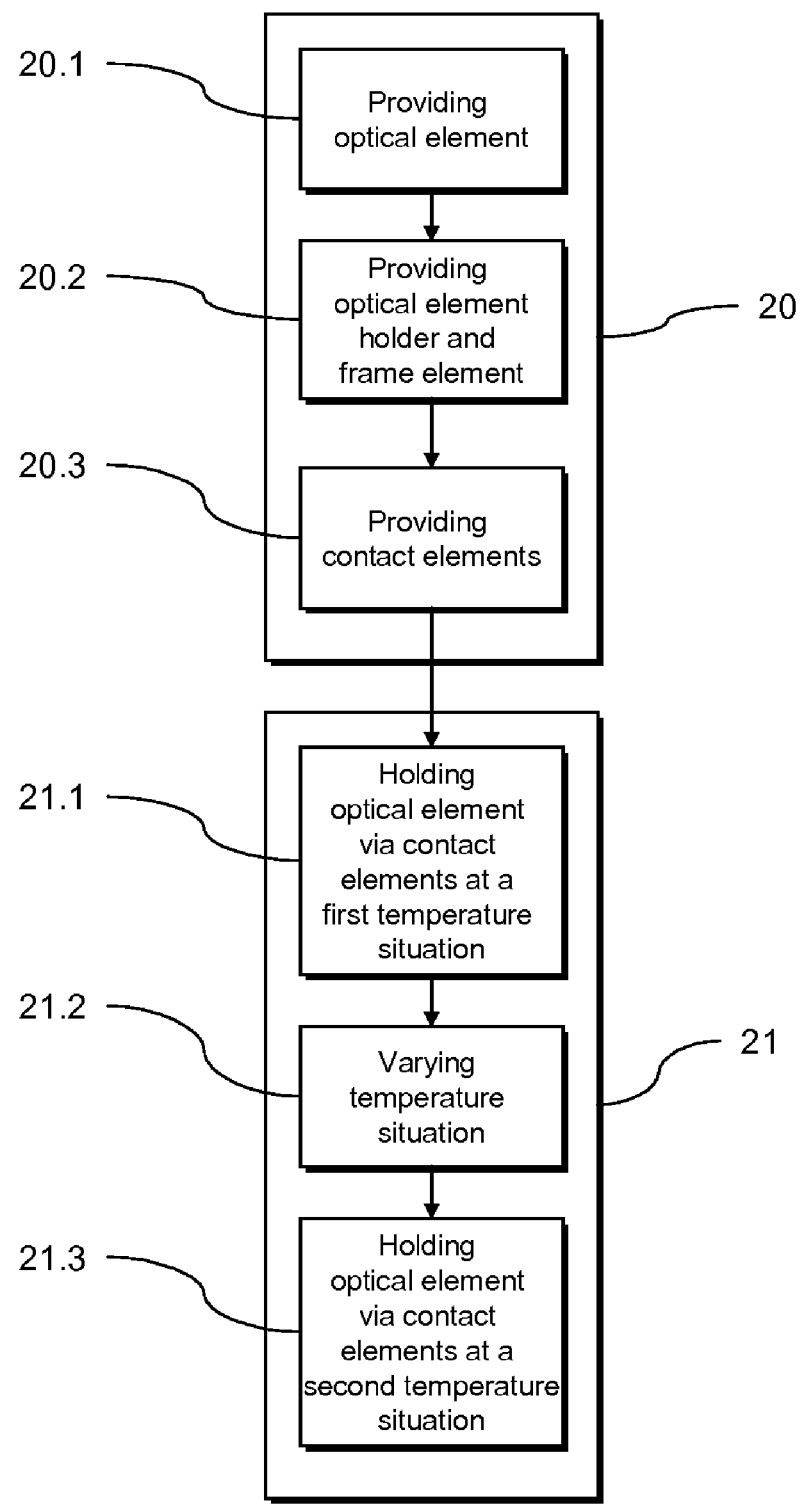
FIG. 4 is a block diagram of a method of holding an optical element.

FIG. 4 shows a block diagram of a preferred embodiment of a method of holding an optical element.

In a first step 20, a plurality of module components 107, 108, 109, 110, 111, 117 of the optical element module 3.3 is provided. At least one of these module components is adapted to provide at least a reduction of forces introduced into the lens 107 upon a thermally induced position change in the relative position between the lens 107 and the lens holder 108.

As mentioned above, the plurality of module components comprises the lens 107 as it has been described above in the context of FIGS. 2 and 3. The lens 107 is provided in a step 20.1.

The plurality of module components further comprises the lens holder 108 and the frame element 109 as they have been described above in the context of FIGS. 2 and 3. The lens holder 108 and the frame element 109 are provided in a step 20.2

The plurality of module components further comprises the first and second contact elements 110 and 111 as they have been described above in the context of FIGS. 2 and 3. The first and second contact elements 110 and 111 are provided in a step 20.3. In this step 20.3 the first and second contact elements 110 and 111 are designed such that they may compensate for the difference in the coefficient of thermal expansion between the lens 107 and the lens holder 108 at a temperature situation variation as it has been described above in the context of FIGS. 2 and 3.

In a step 21.1 of a second step 21, the module components of the optical element module 3.3 are mounted together such that the lens 107, at a first temperature situation, is held by the lens holder 108 via the first and second contact elements 110 and 111 to provide a configuration as it has been described above in the context of FIGS. 2 and 3.

In a step 21.2 a temperature situation variation is provided wherein the temperature situation of the optical element module 3.3 changes from the first temperature situation T1 to the second temperature situation T2 as it has been described above in the context of FIGS. 2 and 3.

In a step 21.3 the lens 107, at said second temperature situation T2, is held by the lens holder 108 via the first and second contact elements 110 and 111 to provide a configuration as it has been described above in the context of FIGS. 2 and 3. As it has been described above in the context of FIGS. 2 and 3, the first and second contact elements 110 and 111 are designed and mounted to the lens holder 108 such that they compensate for the difference in the coefficient of thermal expansion between the lens 107 and the lens holder 108. Thus, at the second temperature situation T2 as well, the lens 107 is held such that substantially not thermally induced radial disturbing forces are introduced into the lens 107.

Second Embodiment

Figure 5:
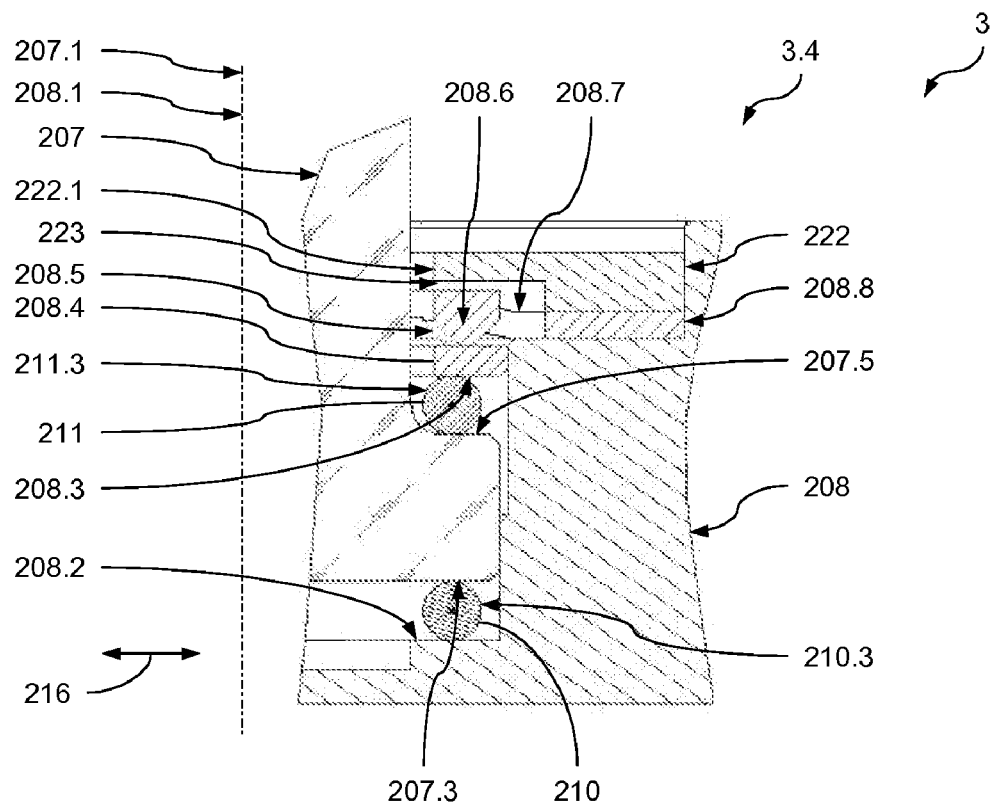
FIG. 5 is a schematic sectional representation of a part of a further optical element module used in the optical exposure apparatus of FIG. 1.

In the following, a second preferred embodiment of an optical element module 3.4 will be described with reference to FIGS. 1 and 5. FIG. 5 shows a schematic sectional representation of a part of the optical element module 3.4 of the optical element unit 3 at a first temperature situation T1 of the optical element unit 3. The first temperature situation T1 is characterized by a certain temperature profile within the components of the optical element unit 3.

The optical element 207 of the optical element module 3.4 is a rotationally symmetric lens having an optical axis 207.1. The lens 207 is made of Quartz ($SiO_2$) and has a first coefficient of thermal expansion.

The lens 207 is usually positioned in space such that the optical axis 207.1 of the lens 207 is substantially collinear with the optical axis 3.2 of the optical element unit 3. It should be noted that the position of the optical axis 207.1 of the lens 207 shown in FIG. 5 is not to scale. In reality, the optical axis 207.1 is located at a distance from the outer circumference of the lens 207 that by far exceeds the distance shown in FIG. 5.

The lens 207 is held by an optical element holder in the form of a ring shaped lens holder 208 which, in turn, may be held by a ring shaped frame element similar to frame element 109 of FIG. 2. The lens holder has a first axis of symmetry 208.1 which coincides with the optical axis 207.1.

The lens holder 208 is made of Invar that has a second coefficient of thermal expansion different from, namely larger than the first coefficient of thermal expansion of the lens 207. The lens holder 208 holds the lens 207 in place via a plurality of first contact elements 210 and a plurality of second contact elements 211.

In the embodiment shown, three first contact elements 210 and three second contact elements 211 are evenly distributed at the inner circumference of the lens holder 208. However, it will be appreciated that, with other embodiments of the disclosure, a different number of first and/or second contact elements may be provided. Furthermore, only one type of contact elements may be provided. For example, only the lower first contact elements may be provided to support the lens from below.

The first contact element 210 is a cylindrical roller of circular cross section. The first contact element 210 is supported on a plane annular first platform 208.2 of the lens holder 208. The plane of the platform 208.2 is substantially perpendicular to the axis 208.1 and, thus, perpendicular to the optical axis 207.1. The first contact element 210 contacts a plane first contact surface 207.3 of the lens 207, the first contact surface 207.3 being perpendicular to the optical axis 207.1.

The second contact element 211 is also a cylindrical roller of circular cross section. The second contact element 211 contacts a plane second contact surface 207.5 of the lens 207, the second contact surface 207.3 also being perpendicular to the optical axis 207.1. The second contact element 211 furthermore contacts a plane annular second platform 208.3 formed on a contact ring 208.4 of the lens holder 208. The plane of the second platform 208.3 is also substantially perpendicular to the axis 208.1 and, thus, perpendicular to the optical axis 207.1.

The first contact element 210 and the second contact element 211, in the situation shown in FIG. 5, are arranged such that they are properly aligned in an axial direction parallel to the optical axis 207.1. The cylindrical surface of the first contact element 210 forms a curved third contact surface 210.3 that contacts the first contact surface 207.3 of the lens 207. Furthermore, the cylindrical surface of the second contact element 211 forms a curved fourth contact surface 211.3 that contacts the second contact surface 207.5 of the lens 207.

To clamp the lens 207 between the first contact element 210 and the second contact element 211, a resilient clamping element 208.5 is connected to the lens holder 208. The clamping element is designed in the manner of the second contact element 111 of FIG. 2. Thus it has a clamping nose 208.6 connected via resilient arms 208.7 to a base part 208.8, which in turn is mounted to the lens holder 208.

The clamping nose 208.6 protrudes in such a manner that the arms 208.7 are elastically deflected when the base part 208.8 is connected to the lens holder 208. As a consequence, the clamping nose 208.6, via the contact ring 208.4 and the second contact element 211, exerts a clamping force F1 onto the second contact surface 207.5 of the lens 207, said clamping force F1 being substantially perpendicular to the second contact surface 207.5. The amount of the clamping force again may be adjusted by a spacer of suitable thickness placed between the base part 208.8 and the lens holder 208.

Since the first contact surface 207.3 and the second contact surface 207.5 are substantially perpendicular to the optical axis 207.1 of the lens 207, at the first temperature situation T1, substantially no radial forces directed radially towards the center of the lens 207 are introduced into the lens 207 by its holding mechanism.

At a transition to a second temperature situation T2 different from the first temperature situation T1, the temperature within the components of the optical element unit 3 is raised by a given amount. As a consequence of the rising temperature, among others, the lens 207 and the lens holder 208 expand in a radial direction 216. Since the second coefficient of thermal expansion of the lens holder 208 is higher than the first coefficient of thermal expansion of the lens 207, the raise in the temperature causes a relative movement between the lens 207 and the lens holder 208 in the radial direction 216 such that the lens holder 208 radially moves away from the lens 207.

As mentioned above, in conventional systems with a conventional clamping mechanism directly acting onto the lens, this would lead to a relative radial movement and a residual elastic deformation at the interface between the respective contact element and the lens, both leading to the introduction of stresses into the optical element radially propagating through the optically used area of the lens. As previously explained, such radial stresses lead to imaging errors such as stress induced birefringence.

However, the curved third contact surface 210.3 of the first contact element 210 and the curved fourth contact surface 211.3 of the second contact element 211, at this thermally induced relative movement between the lens 207 and the lens holder 208, both execute a rolling movement on the first contact surface 207.3 and the second contact surface 207.5, respectively. The curved third contact surface 210.3 and the curved fourth contact surface 211.3 also execute a rolling movement on the first platform 208.2 and the second platform 208.3, respectively. Since both contact elements 210 and 211 have the same diameter, the contact elements 210 and 211 perform a synchronous rotation such that they keep being aligned in a direction parallel to the optical axis 207.1.

This rolling movement is associated with very low frictional forces introduced into the lens 207 and directed in the radial direction 216. It will be appreciated that, in other words, the rolling movement is a substantially pure rolling movement with substantially no friction. The substantially negligible residual friction that occurs here results from the deformation induced deviation of the contact area from the ideal line contact of the cylindrical contact element 210, 211 with its respective contact partner. Thus, a considerable reduction of thermally induced radial disturbing forces is achieved with the disclosure compared to conventional systems without such rolling contact elements. Thus disturbing radial stresses leading to imaging errors such as stress induced birefringence may be reduced considerably with the disclosure.

It will be appreciated that, with other embodiments of the disclosure, the respective first and second contact element does not necessarily have to contact the lens directly. For example, intermediate elements may be connected to the lens and contact the respective contact element. These intermediate elements may also be a clamping element designed in the manner of the clamping element 208.5 as it has been described above.

As outlined above, certain considerably reduced thermally induced radial disturbing forces may be introduced into the lens 207 at a temperature situation variation. However, the disclosure also provides for a further reduction of these thermally induced radial disturbing by the following means.

First of all, as had been explained in the context of FIG. 3, a gravity compensation means similar to the gravity compensation means 117 is provided. This gravity compensation means has the effect that the normal reaction force acting between the first contact elements 210 and the lens 207 perpendicular to the first contact surface 207.3 does not have to include a component resulting from the balancing of the gravitational force acting onto the lens 207. Thus, the first contact elements 210 only exert a reduced normal contact force only balancing the clamping force exerted by the associated second contact elements 211. This reduced normal contact force has the advantage that upon any thermally induced radial relative movement between the lens 207 and the first contact elements 210 only an even further reduced frictional disturbing force acts in the radial direction 216 onto the lens 207, said frictional disturbing force being a function of the normal contact force and the friction coefficient at the contact location.

A further reduction of the frictional disturbing force acting onto the lens 207 upon any thermally induced radial relative movement between the lens 207 and the contact elements 210 and 211 may be achieved by providing at least one of the lens 207 and the first and second contact elements 210 and 211 with a low friction coefficient contact surface, e.g. with a low friction coefficient coating at the respective contact surface, i.e. the first and second contact surface 207.3 and 207.5 and/or the third or fourth contact surface 210.3 and 211.3. By this means as well, only an even further reduced frictional disturbing force acts in the radial direction 216 onto the lens 207 upon such a thermally induced radial relative movement, said frictional disturbing force being a function of the normal contact force and the friction coefficient at the respective contact location.

Finally, a further reduction of the frictional disturbing force acting onto the lens 207 upon any thermally induced radial relative movement between the lens 207 and the contact elements 210 and 211 may be achieved by providing a securing device 222. This securing device 222 overall allows to reduce, under normal operating conditions, the holding forces exerted on the lens 207 and, thus, also the disturbing frictional forces introduced into the lens 207 at a thermally induced relative movement between the lens 207 and the lens holder 208 under normal operating conditions.

This solution is based on the concept that the holding forces usually counteract also the thermally induced relative movement between the lens 207 and the lens holder 208 and, thus, have an influence on the frictional forces introduced into the lens 207 at such a relative movement between the lens 207 and the lens holder 208. Usually, due to the manufacture and mounting of the optical element unit 3 at a location different from the location of its later use, the holding forces provided for the lens 207 do not only account for the forces occurring under normal operating conditions of the optical system but also have to account for considerably higher abnormal forces occurring during transport of the optical element unit 3, for example. Thus, in conventional systems, holding forces exerted onto the lens 207 are considerably higher than necessary in normal use. Due to the correlation between the holding forces and the disturbing forces outlined above, this obviously leads to increased disturbing forces introduced into the lens 207 at a thermally induced relative movement between the lens 207 and the lens holder 208.

The securing device 222, further reduces these disturbing forces by allowing a reduction of the holding forces exerted on the lens 207 under normal operating conditions. The securing device 222 is only activated under abnormal load conditions in order to hold the lens 207. To this end, the securing device 222 is fixedly mounted to the lens holder 208 and provides a stop element 222.1 that is spatially associated to the resiliently mounted clamping nose 208.6 of the respective clamping element 208.5.

The clamping element 208.5, via the second contact element 211, under normal operating conditions of the optical element unit 3, i.e. under a normal load situation, exerts a first holding force onto the lens 207. This first holding force ranges up to a holding force limit is a maximum force that is necessary (together with the holding forces of the other clamping elements 208.5) to hold the lens 207 substantially in place against normal displacement forces to be expected to act onto the lens 207 under said normal load situation.

As long as the displacement forces acting onto the lens 207 do not require exertion of this holding force limit, a small gap 223 is formed between the stop element 222.1 and the clamping nose 208.6. As soon as the holding force limit is reached, the clamping nose 208.6 comes into tight contact with the substantially rigid stop element 222.1 such that the holding forces exerted in the lens 207 abruptly increase to hold the lens 207 in place against abnormal displacement forces exceeding the displacement forces acting under normal operating conditions of the optical element unit 3.

It should be noted that the gap 223 shown in FIG. 5, for reasons of better visibility, is way out of scale. In reality, the gap 223 is sufficiently small to provide sufficient contact between the lens 207 and the contact elements 210, 211 under any load condition.

It will be appreciated that, with other embodiments of the disclosure, the securing device may adapted to contact any other movable part of the clamping element 208.5 or any other suitable part of the lens 207 or any other movable component in mechanical connection with the lens 207. Furthermore, the clamping element may be of any other suitable design that is activated under abnormal load conditions only. For example, it may be an active device, e.g. a electrically, pneumatically or otherwise actuated device, that is actively brought into contact with the lens 207, the clamping nose 208.6 or any other movable component in mechanical connection with the lens 207 under abnormal load situations.

It will be further appreciated that the securing device 222 may also be used in combination with the embodiment shown in FIG. 2 leading to the above beneficial reduction in the necessary holding forces under normal operating conditions.

It will be further appreciated that, with other embodiments of the disclosure, the respective first and second contact element does not necessarily have to be a cylindrical element. It is only necessary that the respective contact element has a curved contact surface that executes, upon a temperature situation variation, a substantially purely rotational movement on an interface surface between the lens and the lens holder where the relative motion occurs. For example, the respective contact element may be a ball shaped element. In this case, the contact partner of the contact element does not necessarily have to provide one single planar contact surface. For example, it is also possible that the ball shaped contacts the two contact surfaces of a substantially V-shaped groove extending in the radial direction. The ball shaped contact element, upon a temperature situation variation, then may execute the substantially frictionless rolling movement along this V-shaped groove. Furthermore, the respective contact element may be fixedly connected to one of the lens 207 and the lens holder 208.

Figures 6A, 6B:
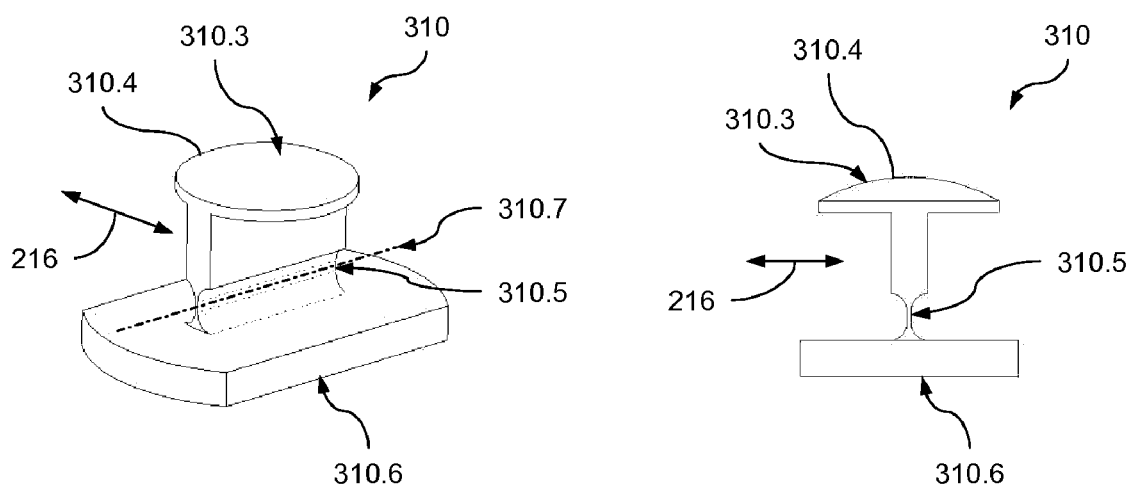
FIG. 6A is a schematic perspective view of a further contact element that may be used in the optical element module of FIG. 5.
FIG. 6B is another schematic view of the contact element of FIG. 6A.

FIGS. 6A and 6B show different views of an example of a contact element 310 that may replace the first contact element 210 and/or the second contact element 211 of FIG. 5. The contact element 310 has a movable contact part 310.4 with a spherical contact surface 310.3. Via a flexure 310.5, the spherical contact part 310.4 is monolithically connected to a base part 310.6. The base part 310.6 may be connected to the lens holder 208 or the lens 207, such that the flexural axis 310.7 of the flexure 310.5 runs perpendicular to the radial direction 216 in a plane perpendicular to the optical axis 207.1 of the lens 207.

It will be appreciated that the optical element unit 3.4 of FIG. 5 may as well be used to perform a method of holding an optical element similar to the one as it has been described above with reference to FIG. 4.

The difference with respect to the method performed with the embodiment of FIG. 2 lies within the fact that, upon any change in the temperature situation, i.e. in step 21.2 of FIG. 4, a relative motion takes place at the mechanical interface between the lens 207 and the lens holder 208. However, this relative motion is a low friction motion, namely a rolling motion.

Third Embodiment

Figure 7A:
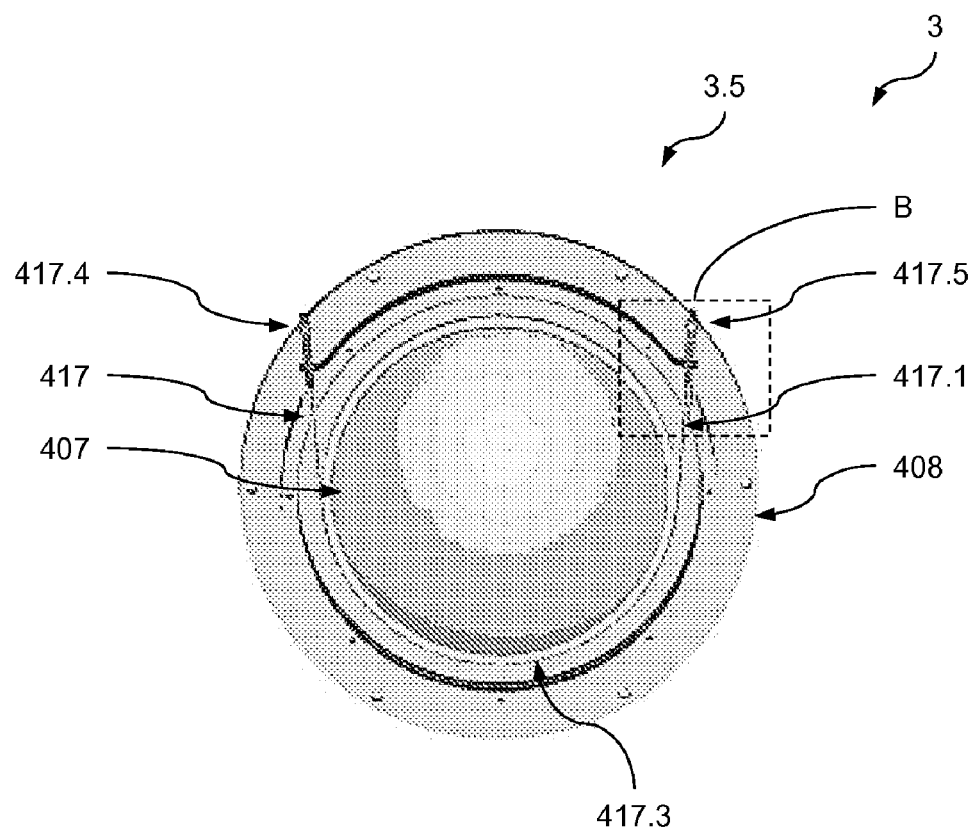
FIG. 7A is a schematic view of a part of a further optical element module used in the optical exposure apparatus of FIG. 1.
Figure 7B:
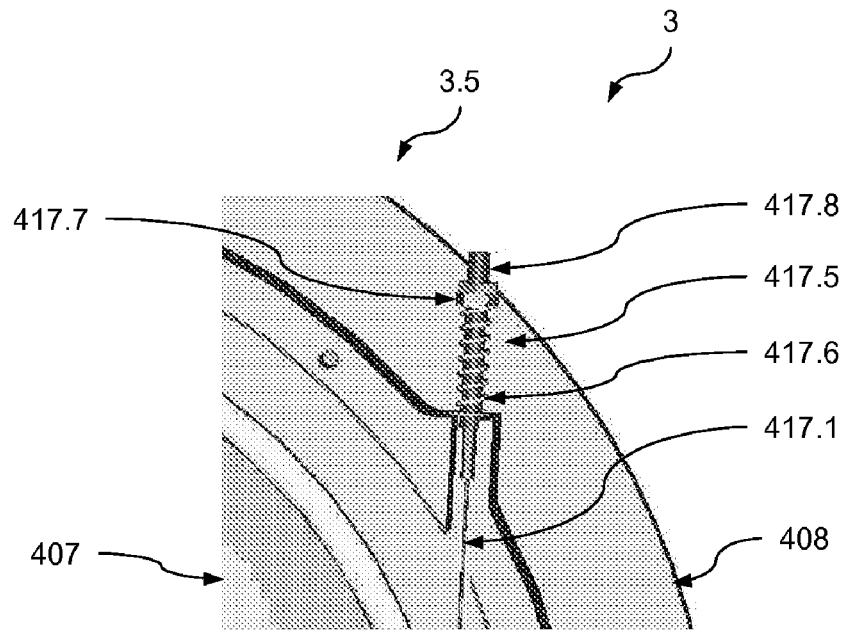
FIG. 7B is a schematic view of the detail B of FIG. 7A.

In the following, a third preferred embodiment of an optical element module 3.5 will be described with reference to FIGS. 1, 7A and 7B. FIGS. 7A and 7B show representations of a part of the optical element module 3.5 of the optical element unit 3.

The optical element 407 of the optical element module 3.5 is a rotationally symmetric lens having an optical axis which, when mounted in the optical element unit 3, lies in a substantially horizontal plane.

The lens 407 is made of Quartz ($SiO_2$) and is held by an optical element holder in the form of a ring shaped lens holder 408. The lens holder has a first axis of symmetry which coincides with the optical axis of the lens 407. The lens holder 408 is made of Invar that has a second coefficient of thermal expansion different from, namely larger than the first coefficient of thermal expansion of the lens 407. The lens holder 408 holds the lens 407 in place via a plurality of first contact elements 410 and a plurality of second contact elements 411 in a manner as it has been described above in the context of FIG. 2, such that it is here mainly referred to the above explanations.

The optical element module 3.5 also has a gravity compensation device 417. This gravity compensation device 417—as the gravity compensation device 117—is adapted to exert a support force onto the lens 407 that substantially balances the gravitational force acting on the lens 407 due to its mass.

Due to the so called standing arrangement of the lens 407, the gravity compensation device 417 comprises a flexible tension element 417.1 in the form of a rope or strap. The tension element 417.1 has a middle section 417.3 and two end sections 417.4 and 417.5. Both end sections 417.4 and 417.5 are hung to the lens holder 408 at a location located above the center of gravity of the lens 407 such that the middle section 417.3 is wrapped around a lower part of the lens 407.

The force exerted by the gravity compensation device 417 onto the lens 407 may be adjusted by adjusting the pretension of springs 417.6 acting via nuts 417.7 onto threaded bolts 417.8 connected to the tension element 417.1 at its respective end section 417.4 and 417.5. The angle of wrap is about 170° such that the forces exerted by the gravity compensation device 417 onto the lens 407 are distributed over a wide area avoiding local stress concentrations.

The lens 407 may be located in a seat within the lens holder 408 precisely defining the position of the lens in the radial direction, i.e. in the vertical plane. Anyway, it will be appreciated that the forces exerted by the gravity compensation device 417 may slightly exceed the gravitational force acting on the lens 407 such that the lens 407 is pulled against a plurality of stops—preferably two stops—provided on the lens holder 408 at the upper circumference of the lens 407 to secure the position of the lens in the vertical plane.

Furthermore, one or several further stops may be provided at the lower part of the lens holder 408 which the lens 407 may contact in case of abnormal vertical loads acting onto the lens 407, e.g. during transport of the optical element unit 3.

Fourth Embodiment

Figure 8A:
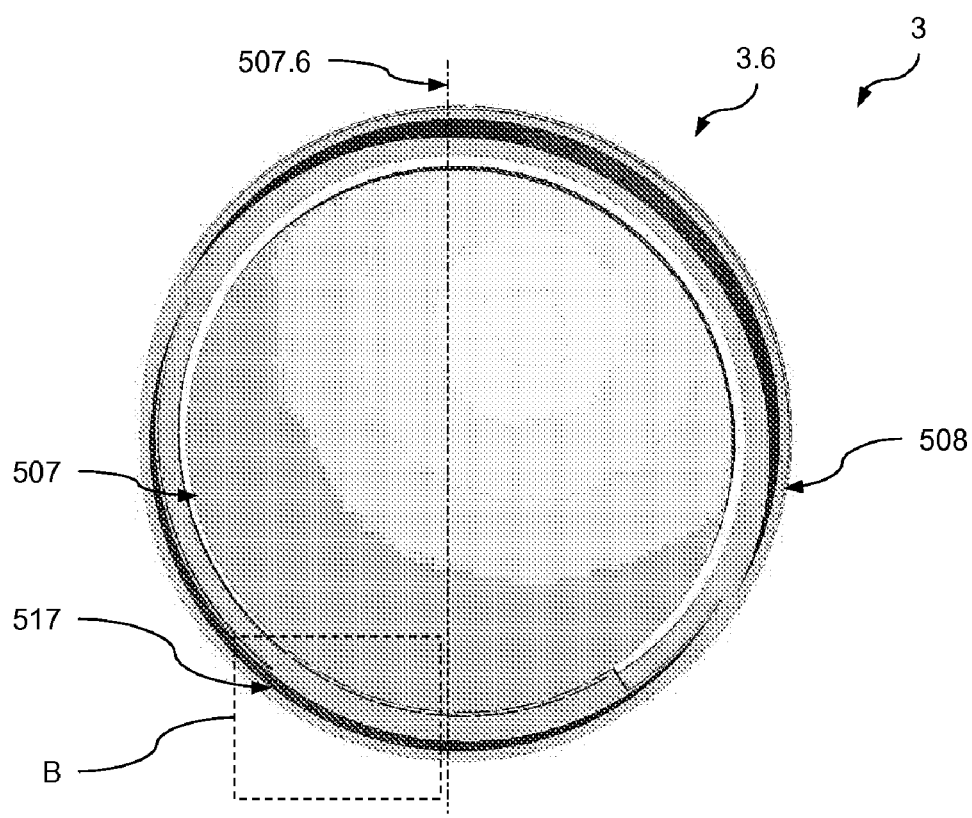
FIG. 8A is a schematic view of a part of a further optical element module used in the optical exposure apparatus of FIG. 1.
Figure 8B:
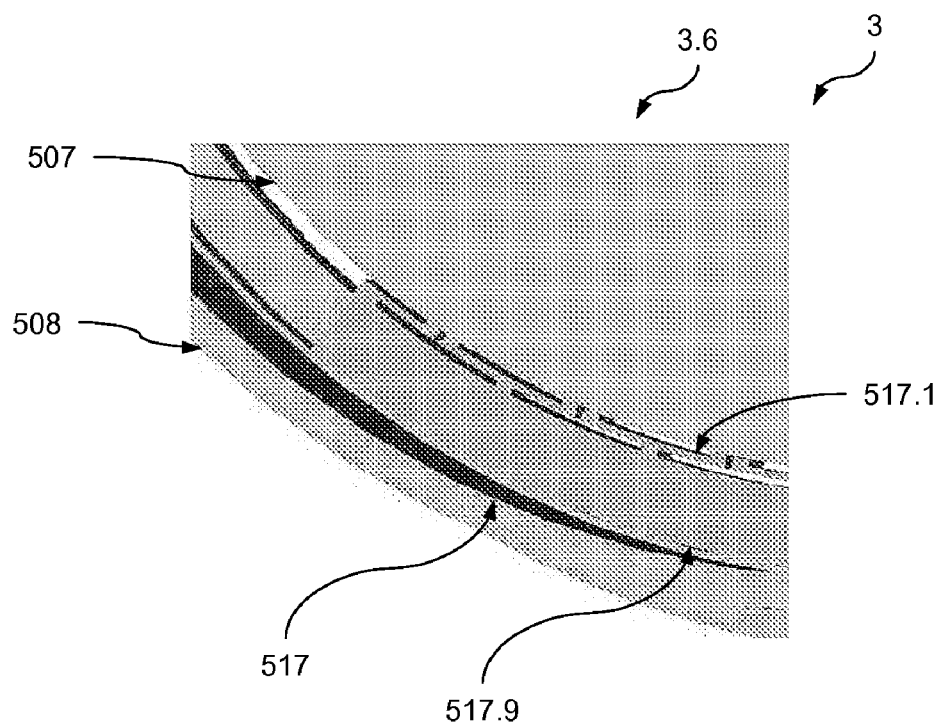
FIG. 8B is a schematic view of the detail B of FIG. 8A.

In the following, a fourth preferred embodiment of an optical element module 3.6 will be described with reference to FIGS. 1, 8A and 8B. FIGS. 8A and 8B show representations of a part of the optical element module 3.6 of the optical element unit 3.

The optical element 507 of the optical element module 3.6 is a rotationally symmetric mirror having an optical axis which, when mounted in the optical element unit 3, lies in a substantially horizontal plane.

The mirror 507 is held by an optical element holder in the form of a ring shaped mirror holder 508. The mirror holder has a first axis of symmetry which coincides with the optical axis of the mirror 507. The mirror holder 508 is made of a material that has a second coefficient of thermal expansion different from, namely larger than the first coefficient of thermal expansion of the mirror 507. The mirror holder 508 holds the mirror 507 in place via a plurality of first contact elements 510 and a plurality of second contact elements 511 in a manner as it has been described above in the context of FIG. 2, such that it is here mainly referred to the above explanations.

The optical element module 3.6 also has a gravity compensation device 517. This gravity compensation device 517—as the gravity compensation devices 117 and 417—is adapted to exert a support force onto the mirror 507 that substantially balances the gravitational force acting on the mirror 507 due to its mass.

Due to the so called standing arrangement of the mirror 507, the gravity compensation device 517 comprises a plurality of resilient force exerting elements 517.1 in the form of leaf spring elements. The leaf spring elements 517.1 are formed by slots in an arc shaped base element 517.9 fixedly connected to the mirror holder 508 at a location located below the center of gravity of the mirror 507. The base element 517.9 is arranges symmetrically with respect to the vertical axis of symmetry 507.6 of the mirror 507.

The free ends of the leaf spring elements 517.1 contact the outer circumference of the mirror 507 over an angle of about 90° in a lower part of the mirror 507. However, it will be appreciated that other angles may be chosen, where appropriate. The leaf spring elements 517.1 are adapted such that the force exerted onto the mirror by the respective leaf spring element 517.1 decreases with increasing distance from the vertical axis 507.6 of the mirror 507. Thus, proper support corresponding to the mass distribution of the mirror is achieved.

Again, the mirror 507 may be located in a seat within the mirror holder 508 precisely defining the position of the mirror in the radial direction, i.e. in the vertical plane. Anyway, it will be appreciated that the forces exerted by the gravity compensation device 517 may slightly exceed the gravitational force acting on the mirror 507 such that the mirror 507 is pushed against a plurality of stops—preferably two stops—provided on the mirror holder 508 at the upper circumference of the mirror 507 to secure the position of the mirror in the vertical plane.

Furthermore, one or several further stops may be provided at the lower part of the mirror holder 508 which the mirror 507 or the leaf springs 517.1 may contact in case of abnormal vertical loads acting onto the mirror 507, e.g. during transport of the optical element unit 3.

Although, in the foregoing, embodiments of the present disclosure have been described where the optical element has a circular shape, it will be appreciated that, with other embodiments of the present disclosure, the optical element may have any other shape. The same applies for the optical element holder.

Furthermore, the present disclosure has been described mostly in the context of embodiments where refractive optical elements such as lenses and plane parallel plates are held by respective optical element holders. However, it will be appreciated that, with other embodiments of the present disclosure, other types of optical elements, such as reflective and/or diffractive optical elements, e.g. mirrors or gratings or the like, may be held by a corresponding optical element holder as it has been described above.

Furthermore, the present disclosure has been described in the context of an optical element unit incorporating different designs of optical element modules. However, it will be appreciated that the disclosure may also be used in the context of optical element units incorporating one single design or type of optical element module.

Furthermore, the present disclosure has been described in the context of an optical element unit having a folded optical axis. However, it will be appreciated that the disclosure may also be used in the context of optical element units having a straight optical axis or an arbitrarily often folded optical axis.

Finally, the present disclosure has been described in the context of embodiments for optical exposure processes. However, it will be appreciated that the disclosure may also be used in the context of any other optical application, where a relief of an optical element from stresses resulting from thermal expansion in the region of the respective optical element is required.

What is claimed is:

1. An optical element module comprising:
    an optical element,
    an optical element holder and
    a first contact element;
    said optical element having a first coefficient of thermal expansion;
    said optical element holder holding said optical element via said first contact element and having a second coefficient of thermal expansion, said second coefficient of thermal expansion being different from said first coefficient of thermal expansion;
    a first contact point being formed on a first module component, said first module component being one of said optical element and said optical element holder;
    said first contact element having a second contact point and a third coefficient of thermal expansion;
    said first contact point, at a first temperature situation, contacting said second contact point at a first location;
    said first contact element contacting a second module component at a second location, said second location, at said first temperature situation, being located at a first contact location distance from said first location;
    said second module component being different from said first module component and being one of said optical element and said optical element holder;
    at least one of said third coefficient of thermal expansion and said contact location distance being selected such that, at a given second temperature situation different from said first temperature situation, a thermally induced modification in the size of said first contact element with respect to said first temperature situation compensates for the difference between said first coefficient of thermal expansion and said second coefficient of thermal expansion such that, at said second temperature situation, there is substantially no shift between said first contact point and said second contact point, wherein
    at least one gravity compensation arrangement is provided;
    said gravity compensation arrangement being held by said optical element holder and contacting said optical element to exert a supporting force onto said optical element;
    said supporting force substantially corresponding to the gravitational force acting onto said optical element.

2. The optical element module according to claim 1, wherein said optical element forms said first module component and said optical element holder forms said second module component.

3. The optical element module according to claim 1, wherein
    said optical element holder is made of a first material and
    said first contact element is made of a second material different from said first material.

4. The optical element module according to claim 1, wherein
    said optical element is made of Quartz ($SiO_2$),
    said optical element holder is made of Invar, and
    said first contact element is made of steel.

5. The optical element module according to claim 1, wherein said third coefficient of thermal expansion is considerably higher than said second coefficient of thermal expansion.

6. The optical element module according to claim 1, wherein
    said optical element mainly extends in a first plane and has a centrally located optical element axis perpendicular to said first plane, and said first contact point is located at a first contact surface of said optical element, said first contact surface being perpendicular to said optical element axis.

7. The optical element module according to claim 1, wherein
said optical element has an outer circumference and
a plurality of first contact elements contacting said optical element and said optical element holder are distributed at said outer circumference.

8. The optical element module according to claim 7, wherein
said optical element holder comprises a ring shaped holder unit;
said holder unit extending along said outer circumference of said optical element and contacting said first contact element.

9. The optical element module according to claim 8, wherein
a ring shaped frame unit is provided;
said frame unit extending along an outer circumference of said optical element holder and holding said optical element holder via a plurality of deformation uncoupling elements.

10. The optical element module according to claim 9, wherein said frame unit is made of a material being, at least with respect to its coefficient of thermal expansion, different from a material said optical element holder is made of.

11. The optical element module according to claim 1, wherein said gravity compensation arrangement comprises at least one gravity compensation element being held by said optical element holder and contacting said optical element.

12. The optical element module according to claim 11, wherein said
a plurality of said gravity compensation elements are provided;
said gravity compensation elements being distributed over at least a part of an outer circumference of said optical element.

13. The optical element module according to claim 1, wherein said gravity compensation element is a resilient element.

14. The optical element module according to claim 1, wherein
said optical element mainly extends in a first plane and has a centrally located optical element axis perpendicular to said first plane;
said optical element axis being one of substantially perpendicular to a horizontal plane or substantially parallel to a horizontal plane.

15. The optical element module according to claim 14, wherein
said optical element axis is substantially parallel to a horizontal plane;
said gravity compensation arrangement comprising at least one flexible tension element;
said tension element having a middle section contacting a lower part of said optical element and two end sections, each end section being hung to said optical element holder.

16. The optical element module according to claim 15, wherein said tension element is one of a rope element or a strap element.

17. An optical element module comprising:
an optical element,
an optical element holder and
a first contact element;

said optical element having a first coefficient of thermal expansion;
said optical element holder holding said optical element via said first contact element and having a second coefficient of thermal expansion, said second coefficient of thermal expansion being different from said first coefficient of thermal expansion;
a first contact point being formed on a first module component, said first module component being one of said optical element and said optical element holder;
said first contact element having a second contact point and a third coefficient of thermal expansion;
said first contact point, at a first temperature situation, contacting said second contact point at a first location;
said first contact element contacting a second module component at a second location, said second location, at said first temperature situation, being located at a first contact location distance from said first location;
said second module component being different from said first module component and being one of said optical element and said optical element holder;
at least one of said third coefficient of thermal expansion and said contact location distance being selected such that, at a given second temperature situation different from said first temperature situation, a thermally induced modification in the size of said first contact element with respect to said first temperature situation compensates for the difference between said first coefficient of thermal expansion and said second coefficient of thermal expansion such that, at said second temperature situation, there is substantially no shift between said first contact point and said second contact point, wherein
a second contact element is provided;
said second contact element contacting said optical element and said optical element holder and having a fourth coefficient of thermal expansion, and wherein
a third contact point is formed on a first connection component, said first connection component being one of said optical element and said optical element holder, and said second contact element has a fourth contact point;
said third contact point, at said first temperature situation, contacting said fourth contact point at a third location;
said second contact element contacting said a second connection component at a fourth location, said fourth location, at said first temperature situation, being located at a second contact location distance from said third location;
said second connection component being different from said first connection component and being one of said optical element and said optical element holder;
at least one of said fourth coefficient of thermal expansion and said second contact location distance being selected such that, at said second temperature situation, a thermally induced modification in the size of said second contact element with respect to said first temperature situation compensates for the difference between said first coefficient of thermal expansion and said second coefficient of thermal expansion such that, at said second temperature situation, there is substantially no shift between said third contact point and said fourth contact point.

18. The optical element module according to claim 17, wherein said optical element forms said first connection component and said optical element holder forms said second connection component.

19. The optical element module according to claim 18, wherein
said optical element mainly extends in a first plane and has a centrally located optical element axis perpendicular to said first plane, and
said third contact point is located at a second contact surface of said optical element, said second contact surface being perpendicular to said optical element axis.

20. The optical element module according to claim 17, wherein said optical element is clamped between said first contact element and said second contact element.

21. The optical element module according to claim 17, wherein said second contact element is resiliently contacting said optical element.

22. The optical element module according to claim 21, wherein
said second contact element has a first contact part and a second contact part;
said first contact part contacting said optical element;
said second contact part contacting said optical element holder;
said first contact part being resiliently connected to said second contact part.

23. The optical element module according to claim 22, wherein said first contact part is connected to said second contact part via at least one resilient arm.

24. The optical element module according to claim 21, wherein
a stop element is provided and
said second contact element has a moveable part and a fixed part;
said moveable part contacting said first connection component;
said fixed part contacting said second connection component;
said stop element being located at a stop distance from said moveable part and being adapted to limit a movement of said moveable part in a first direction away from said first connection component.

25. The optical element module according to claim 24, wherein
said stop distance is selected as a function of a maximum force to be expected to act onto said moveable part in said first direction during normal operation of said optical element module;
said selection of said stop distance being such that said moveable part contacts said stop element when experiencing an abnormal force in said first direction, said abnormal force exceeding said maximum force.

26. The optical element module according to claim 17, wherein said second contact element is made of a material being, at least with respect to its coefficient of thermal expansion, different from a material said optical element holder is made of.

27. The optical element module according to claim 17, wherein
said optical element is made of Quartz ($SiO_2$),
said optical element holder is made of Invar, and
said second contact element is made of steel.

28. The optical element module according to claim 17, wherein said fourth coefficient of thermal expansion is considerably higher than said second coefficient of thermal expansion.

29. The optical element module according to claim 17, wherein
said optical element has an outer circumference and
a plurality of second contact elements contacting said optical element and said optical element holder are distributed at said outer circumference.

30. An optical element module comprising:
an optical element,
an optical element holder and
a first contact element;
said optical element having a first coefficient of thermal expansion;
said optical element holder holding said optical element via said first contact element and having a second coefficient of thermal expansion, said second coefficient of thermal expansion being different from said first coefficient of thermal expansion;
one of said optical element and said optical element holder forming a first module component;
one of said optical element and said optical element holder forming a second module component being different from said first module component;
a first contact surface being formed on said first module component;
said first contact element having a curved second contact surface contacting said first contact surface;
said first contact element being adapted such that said second contact surface executes a rolling motion with respect to said first contact surface upon a thermally induced change in the relative position between said optical element and said optical element holder.

31. The optical element module according to claim 30, wherein said optical element forms said first module component and said optical element holder forms said second module component.

32. The optical element module according to claim 30, wherein
said optical element mainly extends in a first plane and has a centrally located optical element axis perpendicular to said first plane, and
said first contact surface is perpendicular to said optical element axis.

33. The optical element module according to claim 30, wherein said first contact element is connected to said second module component via a hinge element.

34. The optical element module according to claim 30, wherein said first contact element is a separate part contacting said second module component.

35. The optical element module according to claim 30, wherein
said second module component has a third contact surface and
said first contact element has a curved fourth contact surface contacting said third contact surface;
said first contact element being adapted such that said fourth contact surface executes a rolling motion with respect to said third contact surface upon a thermally induced change in the relative position between said optical element and said optical element holder.

36. The optical element module according to claim 35, wherein
said optical element mainly extends in a first plane and has a centrally located optical element axis perpendicular to said first plane, and
said third contact surface is perpendicular to said optical element axis.

37. The optical element module according to claim 30, wherein said first contact element is one of a cylindrical body or a spherical body.

38. The optical element module according to claim 30, wherein
said optical element has an outer circumference and
a plurality of first contact elements contacting said optical element are distributed at said outer circumference.

39. The optical element module according to claim 30, wherein said optical element holder comprises a ring shaped holder unit, said holder unit extending along an outer circumference of said optical element.

40. The optical element module according to claim 39, wherein
a ring shaped frame unit is provided;
said frame unit extending along an outer circumference of said optical element holder and holding said optical element holder via a plurality of deformation uncoupling elements.

41. The optical element module according to claim 40, wherein said frame unit is made of a material being, at least with respect to its coefficient of thermal expansion, different from a material said optical element holder is made of.

42. The optical element module according to claim 30, wherein
at least one gravity compensation arrangement is provided;
said gravity compensation arrangement being held by said optical element holder and contacting said optical element to exert a supporting force onto said optical element;
said supporting force substantially corresponding to the gravitational force acting onto said optical element.

43. The optical element module according to claim 42, wherein said gravity compensation arrangement comprises at least one gravity compensation element being held by said optical element holder and contacting said optical element.

44. The optical element module according to claim 43, wherein said
a plurality of said gravity compensation elements are provided;
said gravity compensation elements being distributed over at least a part of an outer circumference of said optical element.

45. The optical element module according to claim 43, wherein said at least one gravity compensation element is a resilient element.

46. The optical element module according to claim 43, wherein
said optical element mainly extends in a first plane and has a centrally located optical element axis perpendicular to said first plane;
said optical element axis being one of substantially perpendicular to a horizontal plane or substantially parallel to a horizontal plane.

47. The optical element module according to claim 46, wherein
said optical element axis is substantially parallel to a horizontal plane;
said gravity compensation arrangement comprising at least one flexible tension element;
said tension element having a middle section contacting a lower part of said optical element and two end sections, each end section being hung to said optical element holder.

48. The optical element module according to claim 47, wherein said tension element is one of a rope element or a strap element.

49. The optical element module according to claim 30, wherein
a second contact element is provided;

one of said optical element and said optical element holder forming a first connection component,
one of said optical element and said optical element holder forming a second connection component being different from said first connection component;
a fifth contact surface being formed on said first connection component;
said second contact element contacting said fifth contact surface and being one of connected to said second connection component via a hinge element and contacting said second connection component.

50. The optical element module according to claim 49, wherein said optical element forms said first connection component and said optical element holder forms said second connection component.

51. The optical element module according to claim 49, wherein
said second contact element has a curved sixth contact surface contacting said fifth contact surface;
said second contact element being adapted such that said sixth contact surface executes a rolling motion with respect to said fifth contact surface upon a thermally induced change in the relative position between said optical element and said optical element holder.

52. The optical element module according to claim 51, wherein
said optical element mainly extends in a first plane and has a centrally located optical element axis perpendicular to said first plane, and
said fifth contact surface is perpendicular to said optical element axis.

53. The optical element module according to claim 49, wherein
said second connection component has a seventh contact surface and
said second contact element has a curved eight contact surface contacting said seventh contact surface;
said second contact element being adapted such that said eight contact surface executes a rolling motion with respect to said seventh contact surface upon a thermally induced change in the relative position between said optical element and said optical element holder.

54. The optical element module according to claim 53, wherein
said optical element mainly extends in a first plane and has a centrally located optical element axis perpendicular to said first plane, and
said seventh contact surface is perpendicular to said optical element axis.

55. The optical element module according to claim 49, wherein said second contact element is one of a cylindrical body or a spherical body.

56. The optical element module according to claim 49, wherein
said optical element has an outer circumference and
a plurality of second contact elements contacting said optical element are distributed at said outer circumference.

57. The optical element module according to claim 49, wherein said first connection component is clamped between said first contact element and said second contact element.

58. The optical element module according to claim 49, wherein said second contact element is resiliently contacting said first connection component.

59. The optical element module according to claim 58, wherein
said second contact element has a first contact part;

said first contact part contacting said first connection component and being resiliently connected to said second connection component.

60. The optical element module according to claim 59, wherein said first contact part is connected to said second connection component via at least one resilient element.

61. The optical element module according to claim 49, wherein said resilient element comprises a resilient arm.

62. The optical element module according to claim 60, wherein
a stop element is provided;
said stop element being located at a stop distance from said resilient element and being adapted to limit a movement of said resilient element in a first direction away from said first connection component.

63. The optical element module according to claim 62, wherein
said stop distance is selected as a function of a maximum force to be expected to act onto said resilient element in said first direction during normal operation of said optical element module;
said selection of said stop distance being such that said resilient element contacts said stop element when experiencing an abnormal force in said first direction, said abnormal force exceeding said maximum force.

64. The optical element module according to claim 49, wherein
said optical element has an outer circumference and
a plurality of second contact elements contacting said optical element are distributed at said outer circumference.

65. An optical element module comprising:
a plurality of module components;
said module components comprising an optical element, an optical element holder and a contact element;
said optical element having a first coefficient of thermal expansion
said optical element holder holding said optical element via said first contact element and having a second coefficient of thermal expansion, said second coefficient of thermal expansion being different from said first coefficient of thermal expansion;
at least one of said module components being adapted to provide at least a reduction of forces introduced into said optical element upon a thermally induced position change in the relative position between said optical element and said optical element holder;
said position change resulting from a temperature situation variation in a temperature situation of said plurality of module components, wherein
said plurality of module components comprises a first module component and a second module component and
a first contact surface is formed on said first module component and a second contact surface is formed on said second module component;
said first contact surface contacting said second contact surface;
at least one of said first contact surface and said second contact surface having a low friction coefficient.

66. The optical element module according to claim 65, wherein at least one of said first contact surface and said second contact surface is formed by a low friction coefficient coating.

67. The optical element module according to claim 65, wherein
said contact element has a third coefficient of thermal expansion;
said third coefficient of thermal expansion being selected such that, at said temperature situation variation, a thermally induced modification in the size of said contact element compensates for said position change.

68. The optical element module according to claim 65, wherein
one of said optical element and said optical element holder forms a first module component;
a first contact surface being formed on said first module component;
said contact element having a curved second contact surface contacting said first contact surface;
said first contact element being adapted such that said second contact surface executes a rolling motion with respect to said first contact surface upon said position change.

69. An optical element unit comprising:
a plurality of optical element modules connected to each other and supporting a plurality of optical elements,
said plurality of optical element modules comprising a first optical element module being an optical element module according to one of claims 1, 30 and 65.

70. An optical element module comprising:
a plurality of module components;
said module components comprising an optical element, an optical element holder and a contact element;
said optical element having a first coefficient of thermal expansion;
said optical element holder holding said optical element via said first contact element and having a second coefficient of thermal expansion, said second coefficient of thermal expansion being different from said first coefficient of thermal expansion;
at least one of said module components being adapted to provide at least a reduction of forces introduced into said optical element upon a thermally induced position change in the relative position between said optical element and said optical element holder;
said position change resulting from a temperature situation variation in a temperature situation of said plurality of module components,
wherein
said contact element is adapted to exert, under a normal load situation, a first holding force onto said optical element, said first holding force ranging up to a holding force limit, and
a securing device is provided;
said normal load situation occurring during normal operation of said optical element module;
said holding force limit being a maximum force necessary to hold said optical element substantially in place against normal displacement forces to be expected to act onto said optical element under said normal load situation;
said securing device being adapted to be activated only under an abnormal load situation wherein displacement forces acting onto said optical element exceed said normal displacement forces;
said securing device being adapted to act, when activated, onto at least one of said optical element and said contact element;
said securing device, when activated, at least supporting said contact element to exert a second holding force onto said optical element, said second holding force holding said optical element substantially in place during said abnormal load situation.

71. The optical element module according to claim 70, wherein
said securing device is a stop device;
said stop device being located at a distance from said optical element and said contact element under said normal operation;
said stop device being activated by a contact between said stop device and at least one of said optical element and said contact element.

72. An optical exposure apparatus for transferring an image of a pattern formed on a mask onto a substrate comprising:
a light path;
a mask location located within said light path and receiving said mask;
a substrate location located at an end of said light path and receiving said substrate;
an optical element unit according to claim 71 located within said light path between said mask location and said substrate location.

73. A method of holding an optical element comprising:
in a first step, providing a plurality of module components, said module components comprising an optical element, an optical element holder and a contact element, and,
in a second step, holding said optical element using said optical element holder, said optical element holder holding said optical element via said contact element;
said optical element having a first coefficient of thermal expansion;
said optical element holder having a second coefficient of thermal expansion, said second coefficient of thermal expansion being different from said first coefficient of thermal expansion;
at least one of said module components being adapted to provide at least a reduction of forces introduced into said optical element upon a thermally induced position change in the relative position between said optical element and said optical element holder;
said position change resulting from a temperature situation variation in a temperature situation of said plurality of module components, wherein
in said first step, at least one interface is provided between a first module component of said plurality of module components and a second module component of said plurality of module components;
in said second step, holding said optical element in such a manner that, upon said temperature situation variation, a low friction relative motion occurs between said first module component and said second module component at said interface.

74. The method according to claim 73, wherein, in said first step, at least one low friction coefficient surface is provided at said interface.

75. The method according to claim 74, wherein said low friction coefficient surface is formed by depositing a low friction coefficient coating onto of one of said first module component and said second module component.

76. The method according to claim 73, wherein, during said low friction relative motion, a rolling motion is executed at said interface.

77. The method according to claim 73, wherein
in said first step, a contact element is provided, said contact element having a third coefficient of thermal expansion;
said third coefficient of thermal expansion being selected such that, at said temperature situation variation, a thermally induced modification in the size of said contact element compensates for said position change.

78. A method of holding an optical element comprising:
in a first step, providing a plurality of module components, said module components comprising an optical element, an optical element holder and a contact element, and,
in a second step, holding said optical element using said optical element holder, said optical element holder holding said optical element via said contact element;
said optical element having a first coefficient of thermal expansion;
said optical element holder having a second coefficient of thermal expansion, said second coefficient of thermal expansion being different from said first coefficient of thermal expansion;
at least one of said module components being adapted to provide at least a reduction of forces introduced into said optical element upon a thermally induced position change in the relative position between said optical element and said optical element holder;
said position change resulting from a temperature situation variation in a temperature situation of said plurality of module components, wherein, in said second step,
during a normal load situation, a first holding force is exerted onto said optical element and,
during an abnormal load situation, a securing device is activated to at least supporting exertion of a second holding force onto said optical element;
said normal load situation occurring upon normal operation of said optical element module;
said first holding force ranging up to a holding force limit, said holding force limit being a maximum force necessary to hold said optical element substantially in place against normal displacement forces to be expected to act onto said optical element during said normal load situation;
under said abnormal load situation, displacement forces acting onto said optical element exceeding said normal displacement forces;
said second holding force holding said optical element substantially in place during said abnormal load situation.

79. The method according to claim 78, wherein said securing device is activated by contacting one of said optical element and said contact element.

* * * * *

UNITED STATES PATENT AND TRADEMARK OFFICE
CERTIFICATE OF CORRECTION

PATENT NO. : 7,859,641 B2  Page 1 of 1
APPLICATION NO. : 12/015894
DATED : December 28, 2010
INVENTOR(S) : Thomas Bischoff et al.

It is certified that error appears in the above-identified patent and that said Letters Patent is hereby corrected as shown below:

IN THE SPECIFICATIONS:

Column 2, line 50, delete "my" insert --may--.

Column 10, line 6, after "substantially" insert --.--.

Column 12, line 38, after "20.0" insert --.--.

IN THE CLAIMS:

Column 27, Claim 65, line 36, after "expansion" insert --.--.

Signed and Sealed this
Twenty-second Day of March, 2011

David J. Kappos
*Director of the United States Patent and Trademark Office*